United States Patent [19]

Heckaman et al.

[11] Patent Number: 4,956,621

[45] Date of Patent: Sep. 11, 1990

[54] THREE-STATE, TWO-OUTPUT VARIABLE RF POWER DIVIDER

[75] Inventors: Douglas E. Heckaman, Indialantic; John E. Baker; Walter M. Whybrew, both of Palm Bay, all of Fla.

[73] Assignee: Harris Corporation, Melbourne, Fla.

[21] Appl. No.: 129,993

[22] Filed: Dec. 8, 1987

[51] Int. Cl.[5] ........................ H03H 11/36; H01P 5/12

[52] U.S. Cl. ........................................ 333/104; 333/128

[58] Field of Search ............... 333/101, 103, 104, 127, 333/128, 136

[56] References Cited

U.S. PATENT DOCUMENTS

| | | | |
|---|---|---|---|
| 3,233,195 | 2/1966 | Barraclough | 333/104 |
| 3,678,414 | 7/1972 | Hallford | 333/104 |
| 3,720,888 | 3/1973 | Manuali | 333/103 |
| 4,254,386 | 3/1981 | Nemit et al. | 333/128 |
| 4,296,414 | 10/1981 | Beyer et al. | 333/103 X |
| 4,502,027 | 2/1985 | Ayasli | 333/103 |
| 4,789,846 | 12/1988 | Matsunaga | 333/104 |

FOREIGN PATENT DOCUMENTS

| | | | |
|---|---|---|---|
| 242251 | 9/1969 | U.S.S.R. | 333/104 |
| 564670 | 8/1977 | U.S.S.R. | 333/103 |
| 915134 | 3/1982 | U.S.S.R. | 333/104 |
| 936105 | 6/1982 | U.S.S.R. | 333/101 |
| 1419500 | 12/1975 | United Kingdom | 333/125 |

OTHER PUBLICATIONS

Voskanyan R. V. et al; "Microstrip Two-arm Switch for the 3 cm Range", *Instruments & Experimental Techniques;* vol, 19, No. 3, part 2; pp. 791–793; Dec. 1976.

*Primary Examiner*—Eugene R. Laroche
*Assistant Examiner*—Benny Lee
*Attorney, Agent, or Firm*—Evenson, Wands, Edwards, Lenahan & McKeown

[57] ABSTRACT

A three-state, two-output R.F. power divider is configured as a microstrip device having an input port and first and second output ports. Between these three ports there is disposed a substantially T-shaped microstrip transmission line structure such that the input port is coupled to a base portion of the T-shaped structure and the first and second output ports are coupled to opposite ends of a top portion of the T-shaped structure. A substantially U-shapped microstrip transmission line structure is intercoupled with the T-shaped structure such that end portions of the U-shaped structure are coupled to the top portion of the T-shaped structure and a bottom portion of the U-shaped structure is coupled to the base portion of the T-shaped structure. A first PIN diode is coupled between a first location of the T-shaped structure and a ground plane brassboard underlying the dielectric layer on which the microstrip metalization is formed. Second and third PIN diodes are coupled between second and third respective locations of the U-shaped structure and the ground plane. Power is selectively coupled from the input port and the two output ports by contollably biasing the shunting action of the three PIN diodes, such that two diodes operate as shunts, while the other diode remains open.

14 Claims, 2 Drawing Sheets

THREE-STATE, TWO-OUTPUT VARIABLE RF POWER DIVIDER

The U.S. Government has rights in connection with the present patent application with respect to RADC Contract No. F30602-86-C0046.

FIELD OF THE INVENTION

The present invention relates in general to communication systems and is particularly directed to a monolithic microstrip power divider for controllably coupling an input signal applied to an input terminal thereof to a selected one or both of a pair of output terminals.

BACKGROUND OF THE INVENTION

Signal processing and distribution networks, such as those employed within phased array antennas, switched beam antennas and sector scanning satellite antennas, typically require the use of signal coupling devices which subdivide or distribute a signal of interest to a plurality of ports In environments, such as airborne and spaceborne systems, where volume and weight constraints dictate the need for reduced size and low power, conventional power divider networks, containing elements such as ferrite circulators, do not offer a practical scheme for meeting the requirements of low loss, minimum D.C. power consumption and reduced cost.

SUMMARY OF THE INVENTION

In accordance with the present invention, there is provided a new and improved microwave power divider that is particularly suited to meeting the demands of complex, limited size communication systems, such as satellite antenna networks, which employ large numbers of power distribution and switching devices. Pursuant to the present invention, controlled distribution of microwave power is accomplished by means of a device having an input terminal and a pair of output terminals intercoupled thereto by means of a symmetrically configured microstrip signal conductor array, at prescribed intersection or crosspoints of which PIN diodes are disposed for controllably shorting respective conductive arms of the array to a ground plane conductor.

In particular, the power divider is configured as a three-state, two-output variable RF power microstrip device having an input port and first and second output ports. Between these three ports there is disposed a substantially T-shaped microstrip transmission line structure such that the input port is coupled to a base portion of the T-shaped structure and the first and second output ports are coupled to opposite ends of a top portion of the T-shaped structure. A substantially U-shaped microstrip transmission line structure is intercoupled with the T-shaped structure such that end portions of the U-shaped structure are coupled to the top portion of the T-shaped structure and a bottom portion of the U-shaped structure is coupled to the base portion of the T-shaped structure. A first PIN diode is coupled between a first location of the T-shaped structure and a ground plane brassboard underlying the dielectric layer on which the microstrip metalization is formed. Second and third PIN diodes are coupled between second and third respective locations of the U-shaped structure and the ground plane. Power is selectively coupled from the input port and the two output ports by controllably biasing the shunting action of the three PIN diodes, such that two diodes operate as shunts while the other diode remains open.

DETAILED DESCRIPTION

Figure 1:
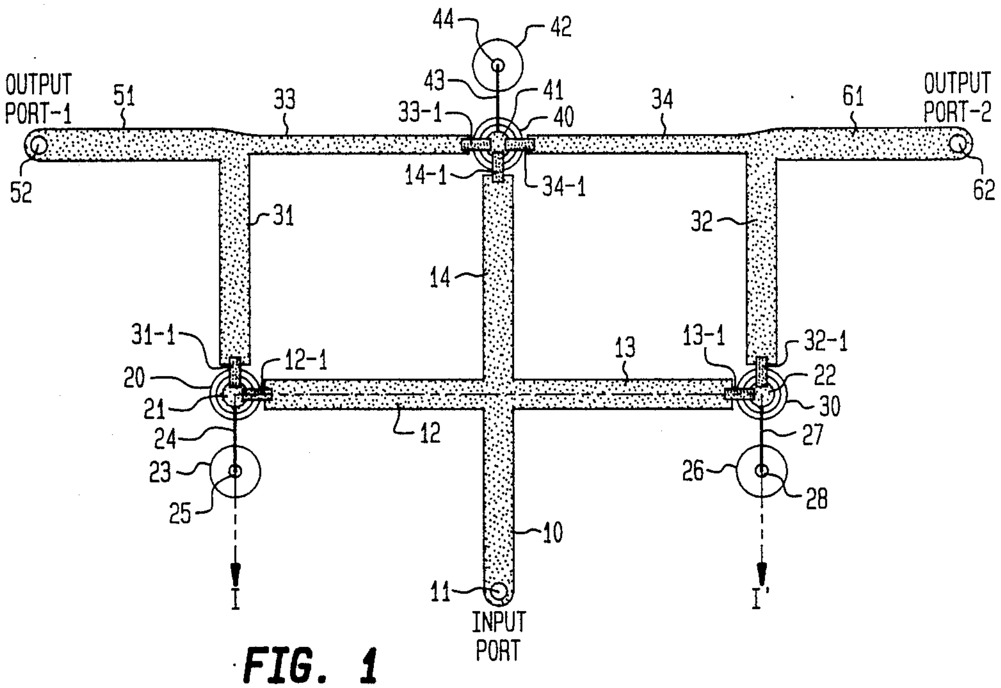
FIG. 1 shows a diagrammatic top view of a three-state, two-output variable RF power divider in accordance an embodiment of the present invention.
Figure 2:
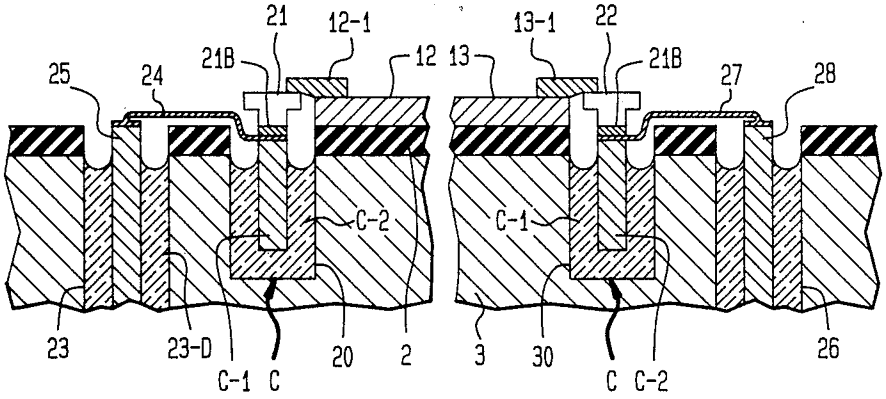
FIG. 2 is an enlarged side view of the three-state, two-output variable RF power divider of FIG. 1, taken along lines 1—1'.

Referring now to FIGS. 1 and 2 of the drawings there are shown respective diagrammatic top and side views of the three-state, two-output variable RF power divider in accordance with the present invention. As shown therein, the power divider is comprised of a microstrip arrangement of a selectively formed conductive layer 1 (e.g. gold, copper) having a thickness on the order of several mils atop a thin layer 2 of dielectric situated atop a ground plane conductive board 3, such as a brassboard. The dielectric layer 2 may comprise a layer of Teflon having a thickness on the order of 30 mils mounted atop a conventional sheet of brassboard material.

As illustrated in FIG. 1, the power divider comprises a quarter wavelength microstrip transmission line (50 ohm characteristic impedance) input coupling section 10 formed of a conductive (e.g..metal) strip (e.g. copper having a width on the order of 0.090 inches and a length on the order of 0.520 inches. which corresponds to a quarter wavelength of a frequency of 3GHz). Microstrip input coupling section 10 extends from an input port, defined by a hole 11 extending through an end of input coupling section (strip) 10 and the underlying dielectric layer 2 and brassboard 3, (see FIG. 2), so as to permit a suitable pass-through connection for attachment of an external circuit to the end of the input strip 10.

Extending orthogonally to either side of the input coupling section 10 are a pair of 50 ohm coupling sections 12 and 13, each being a quarter wavelength in length from end-to-end ($\approx$0.615 inches). The far ends of coupling sections 12 and 13 remote from their ends contiguous with input coupling section 10 are disposed adjacent to and are connected with respective shunting PIN diodes 21 and 22 by way of ribbon strips 12-1 and 13-1, respectively. As shown in FIG. 2, at the left-hand end of coupling section 12, diode 21 is preferably situated atop a cylindrical capacitor C formed of a central conductor C-1 supported within a surrounding dielectric casing C-2 and the sidewalls of cylindrical aperture 20 in brassboard 3. The bottom portion 21B of diode 21 is connected by way of a conductive link (wire or ribbon) 24 to a bias supply pin 25 extending through a layer of dielectric 23-D formed in an aperture 23 which extends through the dielectric layer 2 and brassboard 3 to a diode bias supply conductor (not shown).

In a similar manner the right-hand edge of microstrip layer 13 is coupled via a conductive ribbon 13-1 to a PIN diode 22 (which rests atop a coaxial capacitor C within an aperture 30 and has a conductive link 27 coupled to feed through pin 28 for supplying a bias to the diode. Feed through pin 28, like feed through pin 25, extends through an aperture 26 passing through the underlying dielectric layer 2 and brassboard 3 to an external supply terminal connections. A bypass capacitor defined by dielectric layer 23-D and the effective line length of pin 25 and conductive link 24 results in the formation of a decoupling high impedance at the junction of link 24 and the bottom portion 21B of diode 21.

Diodes 21 and 22 are also coupled via ribbon links 31-1 and 32-1 to a respective pair of 50 ohm quarter wavelength microstrip links 31 and 32 which are orthogonal to the direction of microstrip coupling sections 12 and 13 and, preferably, substantially parallel with input coupling section 10 for layout purposes. Extending from the "T" intersection of microstrip sections 10, 12 and 13 is a further 50 ohm quarter wavelength microstrip coupling section 14 (length on the order of 0.600 inches). The opposite end of microstrip section 14 is connected via a ribbon link 14-1 to a third PIN diode 41, which is biased by way of link 43 and feedthrough pin 44, extending through an aperture 42 in the underlying support laminate. Diode 41, like diodes 21 and 22, is coupled to a cylindrical capacitor disposed in cylindrical aperture 40 in the underlying support laminate.

Connected to diode 41 and extending orthogonal to the direction of microstrip section 14 are a pair of (approximately) 70 ohm quarter wavelength microstrip coupling sections 33 and 34 (the increased impedance obtained by a reduced width or transverse dimension on the order of 0.050 inches as contrasted with the 0.090 inches width of 50 ohm microstrip sections 10-14, 31 and 32).

The pair of 70 ohm microstrip coupling sections 33 and 34 are coupled to diode 41 via ribbon links 33-1 and 34-1, respectively, and intersect 50 ohm quarter wavelength microstrip sections 31 and 32, as shown in the top view of FIG. 1. A pair of additional coupling microstrip sections 51 and 61 (each having a characteristic impedance of 50 ohms) extend to respective output ports 52 and 62 configured in the manner of input port 11 of input coupling section 10.

In operation, each of the PIN diodes 21, 22 and 41 is controllably operated in shunt mode with control power for the diodes supplied by way of bias inputs 25 and 28 and 44. respectively. The DC return is by way of the microstrip coupling sections.

In a power splitting mode of operation, where power is to be equally divided between input port 11 and output ports 52 and 62, each of diodes 21 and 22 is biased to shunt quarter wavelength microstrip coupling sections 12 and 13 to ground while diode 41 remains open. As a consequence, coupling sections 12 and 13 are effectively reflective transmission lines and all input power is coupled through link 14 to be equally divided at output ports 52 and 62. (It should be observed that while the embodiment of the invention described in the present example is effectively symmetrically configured for equal or balanced power split, it may be modified to obtain an unequal power division, as desired, by modifying the characteristic impedance of the microstrip sections (for example by varying the widths of respective sections such as metallic links 33 and 34).)

In a first power switching mode, where power is to be diverted to output port 52 alone, diode 21 is left open, whereas diodes 41 and 22 are shunted to ground, causing sections 13 and 14 to appear as reflective transmission lines, so that all of the power is diverted by way of microstrip links 10, 12, 31 and 51 to output port 52.

In a second power switching mode, where power is to be diverted to only output port 62, diodes 41 and 21 are shunted to ground, causing coupling sections 12 and 14 to appear reflective, so that the power is directed along microstrip sections 10, 13, 32 and 61 to port 62.

As noted above, the impedance of quarter wavelength microstrip coupling sections 10, 12, 13, 14, 31 and 32 is on the order of 50 ohms, while the impedance of quarter wavelength microstrip coupling sections 33 and 34 is 70 ohms. With the power splitting mode of operation, the transmission line links between the input port and the output ports are effectively connected in parallel. Consequently, from the split point whereat sections 33 and 34 diverge at the coupling of diode 41, the impedance through the quarter wave microstrip coupling sections 33 and 34 is increased to a value on the order of 70 ohms, in order to provide the requisite characteristic impedance throughout the interconnect structure. Conventional practice is to terminate an output port at 50 ohms impedance. From the definition of the impedance of a quarter wavelength transforming microstrip section $(Z_{IN}Z_{OUT})^{\frac{1}{2}}=(50\times100)^{\frac{1}{2}}$ or a value of 70 ohms for each of sections 33 and 34. Namely, the 70 ohm impedance sections 33 and 34 transform the impedance seen at the split point at diode 41 to 100 ohms to each output port so that, when connected in parallel, a 50 ohm impedance results. Thus, the impedance of the transmission line interconnect structure between input port 11 and either or both output ports 52 and 62, regardless of the mode of operation (power splitting mode, first power switching mode, or second power switching mode), remains the same.

Figure 3:
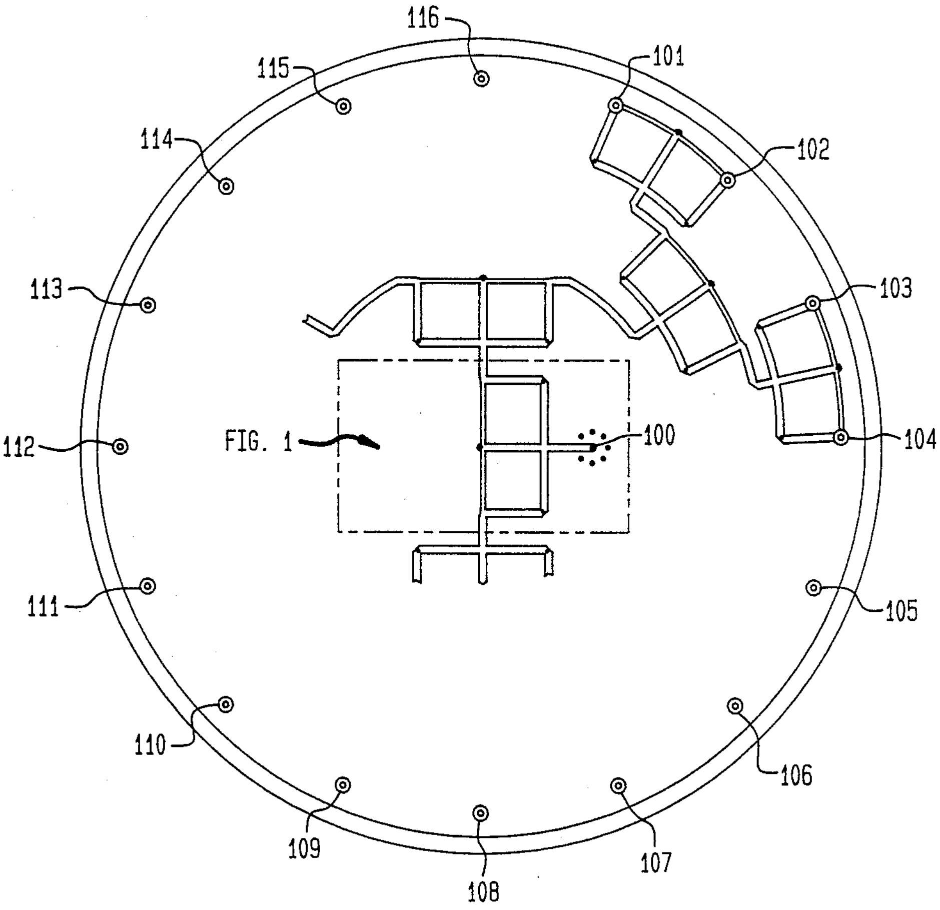
FIG. 3 diagrammatically illustrates the application of the power divider of FIGS. 1 and 2 to multiple cascaded structure for distributing power from an input port to an array of output ports.

As pointed out previously, a plurality of the three state dual output variable power dividers shown in FIGS. 1 and 2 may be connected in a multiple cascaded fashion to provide varying degrees of power distribution from a single input to multiple output ports. An example of the application of the power divider to a multiple cascaded structure to facilitate the distribution of power from an input port to multiple output ports in a compact arrangement is illustrated in FIG. 3. As shown therein, a cascaded power divider has a single input port 100 and 16 output ports 101–116 distributed in a circular array around the center of the array. By fan-out connections of the output ports to input ports of successively radially cascaded power divider configurations of the type shown in FIG. 1, controlled distribution of an RF signal at the input port 100 to output ports 101–116 may be afforded. Thus, a very compact structure, having a PIN diode provided at the center of the array and 44 PIN diodes distributed around the center at switching points of the respective 15 power dividers, may be controllably switched to direct the RF energy that is supplied to input port 100 to selected ones of the output ports 101–116 as desired.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. A signal coupling device comprising:

an input port;

a plurality of output ports;

a transmission line interconnect structure connected between said input port and said plurality of output ports;

a reference conductor spaced-apart from said transmission line structure; and means for selectively controllably coupling said input port to each of said output ports on a selected, exclusive basis, and thereby coupling a signal that is applied to said input port to a selected, exclusive one of said output ports, on the one hand, and also for selectively controllably coupling said input port to plural ones of said output ports and thereby dividing a signal that is applied to said input port among said plural ones of said output ports, on the other hand, exclusive of said one hand, said means comprising a plurality of switching elements coupled to controllably shunt respective portions of said transmission line interconnect structure to said reference conductor; and wherein locations within said transmission line interconnect structure that are controllably shunted by said switching elements and the configuration of said transmission line interconnect structure are such that the impedance of said transmission line interconnect structure presented to an input signal applied to said input port is the same irrespective of whether said input signal is coupled to a selected, exclusive one of said output ports, on the one hand, or is coupled to plural ones of said output ports, on the other hand, when said selected, exclusive one of said output ports, on the one hand, or said plurality of output ports, on the other hand, are terminated in a prescribed impedance; and wherein the number of switching elements of said plurality is equal to the total number of ports of said signal coupling device.

2. A signal coupling device comprising:

an input port;

a plurality of output ports;

a transmission line interconnect structure connected between said input port and said plurality of output ports;

a reference conductor spaced-apart from said transmission line structure; and means for selectively controllably coupling said input port to each of said output ports on a selected, exclusive basis, and thereby coupling a signal that is applied to said input port to a selected, exclusive one of said output ports, on the one hand, and also for selectively controllably coupling said input port to plural ones of said output ports and thereby dividing a signal that is applied to said input port among said plural ones of said output ports, on the other hand, exclusive of said one hand, said means comprising a plurality of switching elements coupled to controllably shunt respective portions of said transmission line interconnect structure to said reference conductor; and wherein locations within said transmission line interconnect structure that are controllably shunted by said switching elements and the configuration of said transmission line interconnect structure are such that the impedance of said transmission line interconnect structure presented to an input signal applied to said input port is the same irrespective of whether said input signal is coupled to a selected, exclusive one of said output ports, on the one hand, or is coupled to plural ones of said output ports, on the other hand, when said selected, exclusive one of said output ports, on the one hand, or said plurality of output ports, on the other hand, are terminated in a prescribed impedance; and wherein the number of switching elements is equal to $(N+1)$, where N is the total number of output ports of said device.

3. A signal coupling device comprising:

an input port;

a plurality of output ports;

a transmission line interconnect structure connected between said input port and said plurality of output ports;

a reference conductor spaced-apart from said transmission line structure; and means for selectively controllably coupling said input port to each of said output ports on a selected, exclusive basis, and thereby coupling a signal that is applied to said input port to a selected, exclusive one of said output ports, on the one hand, and also for selectively controllably coupling said input port to plural ones of said output ports and thereby dividing a signal that is applied to said input port among said plural ones of said output ports, on the other hand, exclusive of said one hand, said means comprising a plurality of switching elements coupled to controllably shunt respective portions of said transmission line interconnect structure to said reference conductor; and wherein locations within said transmission line interconnect structure that are controllably shunted by said switching elements and the configuration of said transmission line interconnect structure are such that the impedance of said transmission line interconnect structure presented to an input signal applied to said input port is the same irrespective of whether said input signal is coupled to a selected, exclusive one of said output ports, on the one hand, or is coupled to plural ones of said output ports, on the other hand, when said selected, exclusive one of said output ports, on the one hand, or said plurality of output ports, on the other hand, are terminated in a prescribed impedance; and wherein said output ports are effectively symmetrically arranged with respect to said input port and said transmission line interconnect structure is effectively symmetrically configured between said input port and said plurality of output ports, and wherein said transmission line interconnect structure is comprised of a microstrip transmission line structure.

4. A signal distribution network comprising:

an input terminal;

a plurality of output terminals; and a plurality of signal coupling devices, each of which includes:

an input port;

a plurality of output ports;

a transmission line interconnect structure connected between said input port and said plurality of output ports;

a reference conductor spaced-apart from said transmission line structure; and means for selectively controllably coupling said input port to each of said output ports on a selected, exclusive basis, and thereby coupling a signal that is applied to said input port to a selected, exclusive one of said output ports, on the one hand, and also for selectively controllably coupling said input port to plural ones of said output ports and thereby dividing a signal that is applied to said input port among said plural ones of said output ports, on the other hand, exclusive of said one hand, said means comprising a plurality of switching elements coupled to controllably shunt respective portions of said transmission line interconnect structure to said reference conductor; and wherein locations within said transmission line interconnect structure that are controllably shunted by said switching elements and the configuration of said transmission line interconnect structure are such that the impedance of said transmission line interconnect structure presented to an input signal applied to said input port is the same irrespective of whether said input signal is coupled to a selected, exclusive one of said output ports, on the one hand, or is coupled to plural ones of said output ports, on the other hand, when said selected, exclusive one of said output ports, on the one hand, or said plurality of output ports, on the other hand, are terminated in a prescribed impedance; and wherein said signal coupling devices are intercoupled in cascade between said input terminal and said plurality of output terminals such that one of said signal coupling devices has its input port coupled to said input terminal and output ports of others of said signal coupling devices are intercoupled in cascade such that a preceding signal coupling device has its output ports coupled to the input ports of succeeding signal coupling devices; and wherein the output ports of a respective signal coupling device are effectively symmetrically configured with respect to the input port thereof and the transmission line interconnect structure of a respective signal coupling device is effectively symmetrically configured between the input port and the plurality of output ports thereof, a respective one of said plurality of signal coupling devices contains two output ports, and, for a respective signal coupling device, said transmission line interconnect structure comprises a first portion extending between said two output ports, a second portion extending between said input port and said first port and third and fourth portions extending between a prescribed location on said second portion and respective locations on said first portion.

5. A microwave signal coupling device comprising:

an input port;

first and second output ports;

a substantially T-shaped microstrip transmission line structure coupled between said input port and said output ports such that said input port is coupled to a base portion of said substantially T-shaped structure and said first and second output ports are coupled to opposite ends of a top portion of said substantially T-shaped microstrip transmission line structure;

a substantially U-shaped microstrip transmission line structure intercoupled with said substantially T-shaped microstrip transmission line structure such that end portions of said substantially U-shaped microstrip transmission line structure are coupled to said top portion of said substantially T-shaped microstrip transmission line structure and a bottom portion of said substantially U-shaped microstrip transmission line structure is coupled to said base portion of said substantially T-shaped microstrip transmission line structure;

a reference conductor spaced-apart from each of said substantially T-shaped and U-shaped microstrip transmission line structures;

a first controlled switching element coupled between a prescribed location of said substantially T-shaped microstrip transmission line structure and said reference conductor, and second and third controlled switching elements coupled between respective locations of said substantially U-shaped microstrip transmission line structure and said reference conductor.

6. A microwave signal coupling device according to claim 5, wherein said first controlled switching element is coupled between said reference conductor and the intersection of the base and top portions of said substantially T-shaped microstrip transmission line structure, and said second and third controlled switching elements are coupled between said reference conductor and respective locations of said substantially U-shaped microstrip transmission line structure on opposite sides of the base portion of said substantially T-shaped microstrip transmission line structure.

7. A microwave signal coupling device according to claim 6, wherein said controlled switching elements comprise PIN diodes.

8. A signal coupling device comprising:

an input port;

a plurality of output ports;

a transmission line interconnect structure connected between said input port and said plurality of output ports;

a reference conductor spaced-apart from said transmission line structure; and means for selectively controllably coupling said input port to each of said output ports on a selected, exclusive basis, and thereby coupling a signal that is applied to said input port to a selected, exclusive one of said output ports, on the one hand, and also for selectively controllably coupling said input port to plural ones of said output ports and thereby dividing a signal that is applied to said input port among said plural ones of said output ports, on the other hand, exclusive of said one hand, said means comprising a plurality of switching elements coupled to controllably shunt respective portions of said transmission line interconnect structure to said reference conductor; and wherein locations within said transmission line interconnect structure that are controllably shunted by said switching elements and the configuration of said transmission line interconnect structure are such that the impedance of said transmission line interconnect structure presented to an input signal applied to said input port is the same irrespective of whether said input signal is coupled to a selected, exclusive one of said output ports, on the one hand, or is coupled to plural ones of said output ports, on the other hand, when said selected, exclusive one of said output ports, on the one hand, or said plurality of output ports, on the other hand, are terminated in a prescribed impedance; and wherein said output ports are effectively symmetrically arranged with respect to said input port and said transmission line interconnect structure is effectively symmetrically configured between said input port and said plurality of output ports, the number of output ports of said plurality is equal to two, and wherein said transmission line interconnect structure comprises a first portion extending between said two output ports, a second portion extending between said input port and said first portion and third and fourth portions extending between a prescribed location on said second portion and respective locations on said first portion.

9. A signal coupling device according to claim 8, wherein each of said switching elements comprises a PIN diode.

10. A signal coupling device according to claim 8, wherein said plurality of switching elements includes a first switching element coupled between the interconnection of said first and second portions and said reference conductor, a second switching element coupled between a prescribed location on said third portion and said reference conductor, and a third switching element coupled between a prescribed location on said fourth portion and said reference conductor.

11. A signal coupling device according to claim 10, wherein each of the respective separations between said prescribed location on said second portion and said prescribed locations on said third and fourth portions whereat said second and third switching elements are coupled corresponds to one-quarter of the wavelength of signals applied at said input port.

12. A signal coupling device according to claim 11, wherein the separation between said prescribed location on said second portion and the interconnection of said first and second portions corresponds to one-quarter of the wavelengths of signals applied to said input port.

13. A signal coupling device according to claim 12, wherein each of the separations between said respective locations, on said first portion of said transmission line structure and the prescribed locations on said third and fourth portions whereat said second switching elements are coupled, respectively corresponds to one-quarter of the wavelength of signals applied at said input port.

14. A signal coupling device according to claim 13, wherein each of the separations between the respective locations on said first portion and the interconnection of said first and second portions corresponds to one-quarter of the wavelength of signals applied at said input port.

* * * * *